United States Patent
Dailey et al.

(10) Patent No.: US 6,600,655 B1
(45) Date of Patent: Jul. 29, 2003

(54) INTEGRATED HEAT SINK, DETECTOR MODULE PLANARIZER, AND APPARATUS FOR EJECTING DETECTOR MODULES

(75) Inventors: George W. Dailey, Glen Ellyn, IL (US); John Thomas Pawlak, Villa Park, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 10/141,182

(22) Filed: May 9, 2002

(51) Int. Cl.[7] .................................................. H05K 7/20
(52) U.S. Cl. ..................... 361/719; 29/741; 361/699; 439/159
(58) Field of Search ........................ 439/76.1, 485, 439/159; 29/741, 758, 764, 890.03; 62/259.2; 257/706, 707, 713, 714, 723, 724; 174/16.3, 252; 165/80.3, 80.4, 104.33, 185; 361/699, 704, 705, 707–712, 717–719, 720

(56) References Cited

U.S. PATENT DOCUMENTS

| | | | | |
|---|---|---|---|---|
| 4,167,031 A | * | 9/1979 | Patel | ........................ 361/709 |
| 4,507,861 A | * | 4/1985 | Sprenkle | ...................... 29/741 |
| 4,521,959 A | * | 6/1985 | Sprenkle | ...................... 29/741 |
| 5,966,289 A | * | 10/1999 | Hastings et al. | ............ 361/704 |
| 6,538,889 B1 | * | 3/2003 | Barsun et al. | .............. 361/704 |

* cited by examiner

*Primary Examiner*—Gerald Tolin
(74) *Attorney, Agent, or Firm*—Rothwell, Figg & Ernst & Manbeck

(57) ABSTRACT

A planarizing heat sink plate having a top portion and a bottom portion is provided. The heat sink plate includes a plurality of receiving means formed therethrough and operable to receive a module ejection device, and at least one removing means formed therethrough and operable to receive a driving device. Also included is at least one planarizing projection formed on the bottom portion and adapted to receive a radiographic sensor module. The at least one removing means is disposed between the plurality of receiving means, and the at least one planarizing projection corresponds to the at least one removing means. The heat sink plate is a multi-functional device that can aid in forming an efficient radiographic detector head comprising a plurality of radiographic sensor modules in the same plane, safely removing the radiographic sensor modules, and conducting heat away from the radiographic sensor modules.

35 Claims, 3 Drawing Sheets

INTEGRATED HEAT SINK, DETECTOR MODULE PLANARIZER, AND APPARATUS FOR EJECTING DETECTOR MODULES

BACKGROUND OF THE INVENTION

1. Field of the Invention

The present invention relates generally to a heat sink, and more particularly to a multi-functional heat sink plate.

2. Description of the Background Art

Radiographic imaging is the detection of radiation in order to form an image. By detecting the amount of radiation emanating from a test subject, the resultant image may give a representative view of the structure of the test subject.

Radiographic imaging typically employs gamma rays. Gamma rays are a form of radiation that is emitted by excited atomic nuclei during the process of passing to a lower excitation state. Gamma radiation is capable of passing through soft tissue and bone. Gamma radiation may be provided by a radiopharmaceutical, such as thallium or technetium, for example, that is administered to the patient. The radiopharmaceutical travels through the patient's body, and may be chosen to be absorbed or retained by an organ of interest. The radiopharmaceutical generates a predictable emission of gamma rays through the patient's body that can be detected and used to create an image.

A radiographic imaging device may be used to detect radiation emanating from the patient and may be used to form an image or images for viewing and diagnosis. The radiographic imaging device may be a device such as a gamma or gamma ray camera, also referred to as a scintillation camera or an Anger camera. The radiographic imaging device allows a doctor to perform a diagnosis on a patient in a non-invasive manner and additionally may allow the doctor to observe organ function. In addition, the radiographic imaging device may be used for other imaging functions.

A radiographic imaging device typically contains one or more radiographic sensor modules, such as a solid state detector module. The detector may be a module made of cadmium zinc telluride (CZT) that generates an electrical signal representative of the location of gamma ray interaction in the detector material. The accumulated counts at each stored location (as stored in a memory device) may be used to create an image of the distributed radiation field of interest.

A number of radiographic sensor modules may be tiled in an array to form a detector head. The detector head may be formed such that the radiographic sensor modules are individually detachable for maintenance, adjustment, etc. Consequently, the radiographic sensor modules can be displaced or misaligned when they are arranged to form the detector head. Further, a radiographic sensor module may become damaged due to the abrupt force applied to it when it is detached from the detector head or a printed circuit board. If a removal tool is used to remove the radiographic sensor module, the removal tool may be inserted at an incline (or angle), thereby damaging the radiographic sensor module.

Sensor heating may also occur in a radiographic imaging device, caused by heat generated during operation. This leads to several problems: the heat may degrade the sensor efficiency; a sensor at elevated temperature has a greater leakage current and a negative impact on semiconductor contact chemistry, etc. In addition, sensor heating may cause mechanical defects, such as warping or expansion and contraction of the sensor material, with resulting cracking or other mechanical failures.

SUMMARY OF THE INVENTION

It is therefore a primary object of the present invention to provide a heat sink which overcomes the above disadvantageous using a multi-functional heat sink plate.

A first aspect of the invention is generally applicable to a planarizing heat sink plate having a top portion and a bottom portion. The heat sink plate includes a plurality of receiving means formed therethrough and operable to receive a module ejection device, and at least one removing means formed therethrough and operable to receive a driving device. Also included is at least one planarizing projection formed on the bottom portion and adapted to receive a radiographic sensor module. The at least one removing means is disposed between the plurality of receiving means, and the at least one planarizing projection corresponds to the at least one removing means.

Another aspect of the present invention is generally directed to a detector module removal system. The removal system includes a module ejection device having a main body with a top portion, a bottom portion and an aperture formed therethrough, and a plurality of elongated members extending from the bottom portion of the main body. A heat sink plate having a top portion, a bottom portion, a plurality of pin holes formed therethrough and at least one through-hole formed therethrough is also included. The pin holes receive the elongated members entering from the bottom portion of the heat sink plate. Also included is a driving device operable to penetrate the aperture from the top portion of the module ejection device and the through-hole from the bottom portion of the heat sink plate. A detector module affixed to the top portion of the heat sink plate is gradually ejected by applying controlled force using the driving device.

Yet another aspect of the present invention is generally applicable to a method of removing a detector module. The method comprises the step of inserting a module ejection device through a heat sink plate containing the detector module. The module ejection device is aligned with the heat sink plate. Also included is the step of providing a driving device through the module ejection device and the heat sink plate. The driving device is substantially perpendicular to the heat sink plate. The step of ejecting the detector module from the heat sink plate by gradually applying a controlled force using the driving device is also provided.

The above and other features and advantages of the present invention will be further understood from the following description of the preferred embodiments thereof, taken in conjunction with the accompanying drawings.

DETAILED DESCRIPTION OF THE PREFERRED EMBODIMENTS

Figure 1:
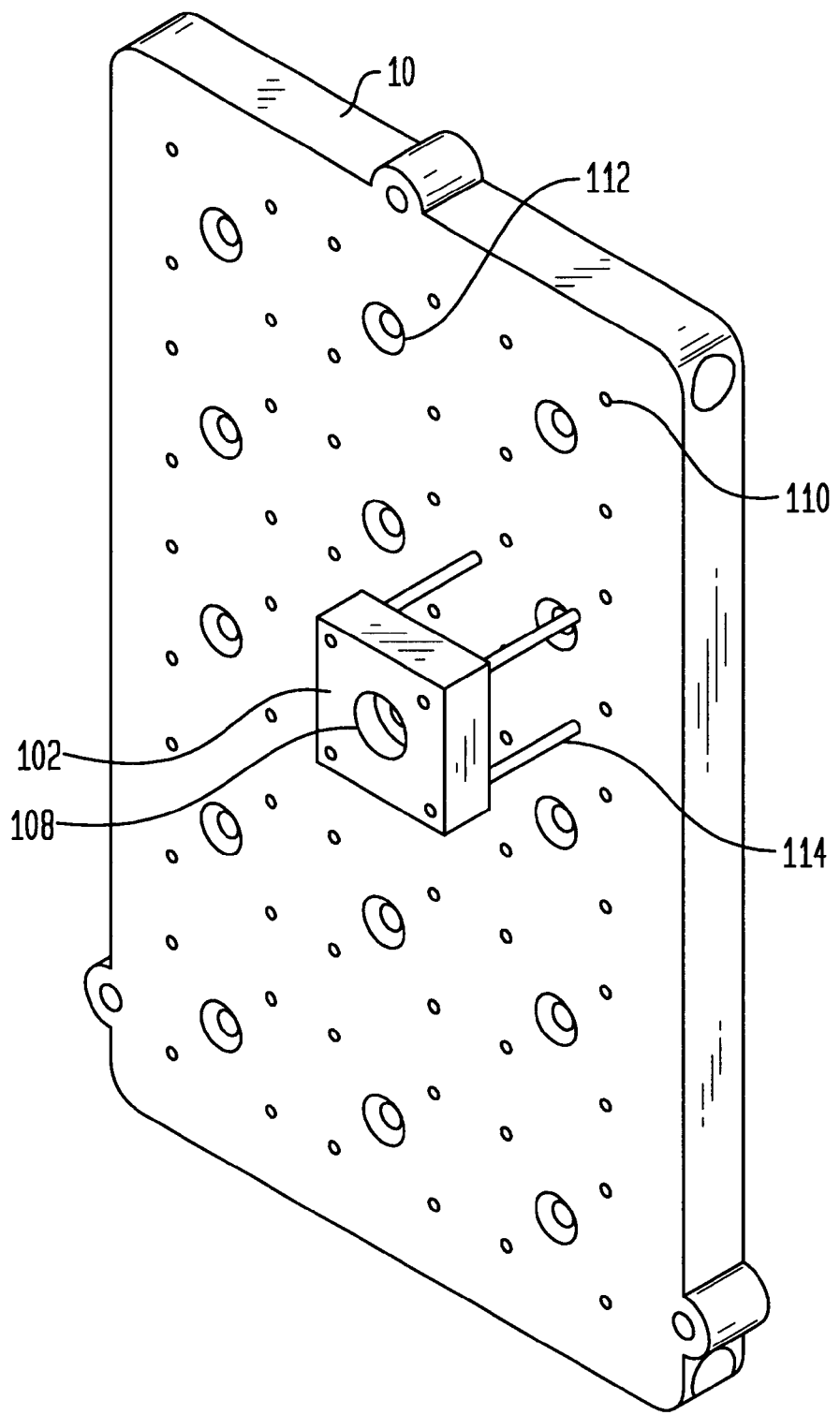
FIG. 1 shows an embodiment of an integrated heat sink plate according to the present invention.
Figure 2:
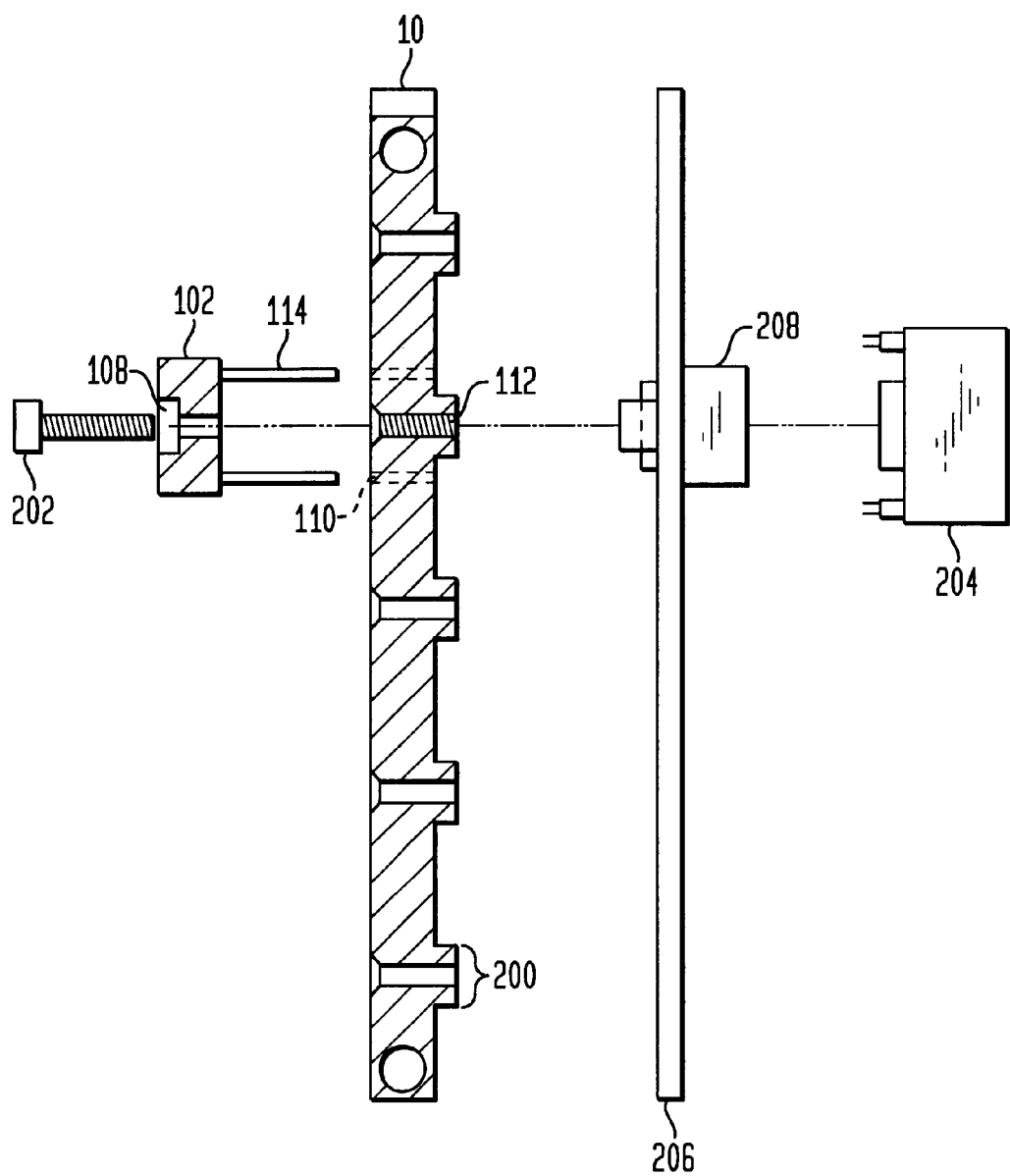
FIG. 2 is a fragmentary sectional view of the heat sink plate according to the present invention.

Reference will now be made in detail to a preferred embodiment of the present invention, an example of which is illustrated in the accompanying drawings. An integrated heat sink plate 10 according to the present invention is shown in FIG. 1. The heat sink plate 10 may include pin holes 110, through-holes 112, and planarizing projections 200 (FIG. 2).

Referring to FIG. 1, the heat sink plate 10 may be a typical heat sink formed of a high thermal conductive material, such as a suitable metal. A set of four pin holes 110 having a small diameter correspond to one through-hole 112 having a larger diameter. However, it will be appreciated that the number, size and shape of the pin holes 110 and the through-hole 112 may be varied. The heat sink plate 10 has a removing side and a mounting side, and is substantially rectangular in shape. However, the heat sink plate 10 may be of other shapes.

In a preferred embodiment of the present invention, the heat sink plate 10 accurately effectuates the ejection or removal of detector modules from a printed circuit board. As shown in FIG. 1, a module ejection device 102 has a main body with a top surface, a bottom surface and a receiving aperture 108 formed through the center of the main body, and four elongated protrusions 114 extending from the bottom surface of the main body. The aperture 108 may have a smooth or threaded inner surface adapted to receive a driving tool 202 (FIG. 2). The four elongated protrusions 114 are adapted to align the module ejection device 102 with respect to the heat sink plate 10. Although three protrusions 114 are visible in the figure, it will be appreciated that the number, size and shape of the protrusions 114 may be varied in order to accommodate various detector modules.

The pin holes 110 of the heat sink plate 10 are pathways for the protrusions 114 of the module ejection device 102 to pass. The through-holes 112 may have a threaded inner surface adapted to receive the driving tool 202. The module ejection device 102 is configured to have the aperture 108 correspond to a respective through-hole 112 of the heat sink plate 10, and protrusions 114 correspond to a set of pin holes 110 of the heat sink 104.

Referring to FIG. 2, a PC board 206 may be in electrical contact with a detector module 204 (only one detector module is shown for simplicity), such as a CZT (cadmium zinc telluride) detector module. The detector module 204 may be any type of solid state detector module that produces an electrical signal in response to incident radiation. The detector modules 204 may be employed in a multi-module array that covers a large imaging area. The detector module 204 may be affixed to a conductive thermal layer 208 of the PC board 206. Each detector module 204 affixed to the PC board 206 corresponds to a planarizing projection 200 and/or through-hole 112 of the heat sink plate 10. The projection 200 protrudes outwardly from the mounting side of the heat sink plate 10 and may house a through-hole 112.

The operation of a detector module removal system will now be described with reference to FIG. 2. The PC board 206 containing the detector modules 204 is mounted to the mounting side of the heat sink plate 10. When a particular detector module 204 is to be removed, the protrusions 114 of the module ejection device 102 are extended through pin holes 110 (corresponding to the detector module) on the removing side of the heat sink plate 10 and the PC board 206. The long bore and closely matching diameter of pin holes 110 guide the module ejection device 102 on an accurate perpendicular path relative to the heat sink plate 10. This ensures evenly distributed ejection force on the detector module 204. Due to the location of the pin holes 110, the aperture 108 of the module ejection device 102 is positioned directly over a respective through-hole 112 (corresponding to the detector module) of the heat sink plate 10.

The driving tool 202 penetrates into and extends through the aperture 108 of the module ejection device 102. The driving tool 202 may be a threaded screw. The threaded driving tool 202 engages the threaded inner surface of the through-hole 112 of the heat sink plate 10 (on the removing side). The driving tool 202 is controllably driven (e.g., screwing the driving tool) to push out or eject the detector module 204, such that the detector module 204 can be easily and accurately removed.

In another embodiment of the present invention, the heat sink plate 10 functions as a detector module planarizer. Since a detector module 204 affixed to the PC board 206 corresponds to a planarizing projection 200 and/or through-hole 112 of the heat sink plate 10, the detector module 204 will be in the same plane with respect to other detector modules. Moreover, the heat sink plate 10 maintains a substantially planar orientation with respect to other detector modules in a multi-sensor device array. Thus, an efficient radiographic detector head for a radiographic imaging device can be realized.

Further, when the PC board 206 (containing the detector modules 204) is mounted to the mounting side of the heat sink plate 10, the PC board 206 is substantially parallel with respect to the heat sink plate 10. The heat sink plate 10 further positions the module ejection device 102 at a planar orientation that is substantially perpendicular to the PC board 206 and/or the heat sink plate 10.

Figure 3:
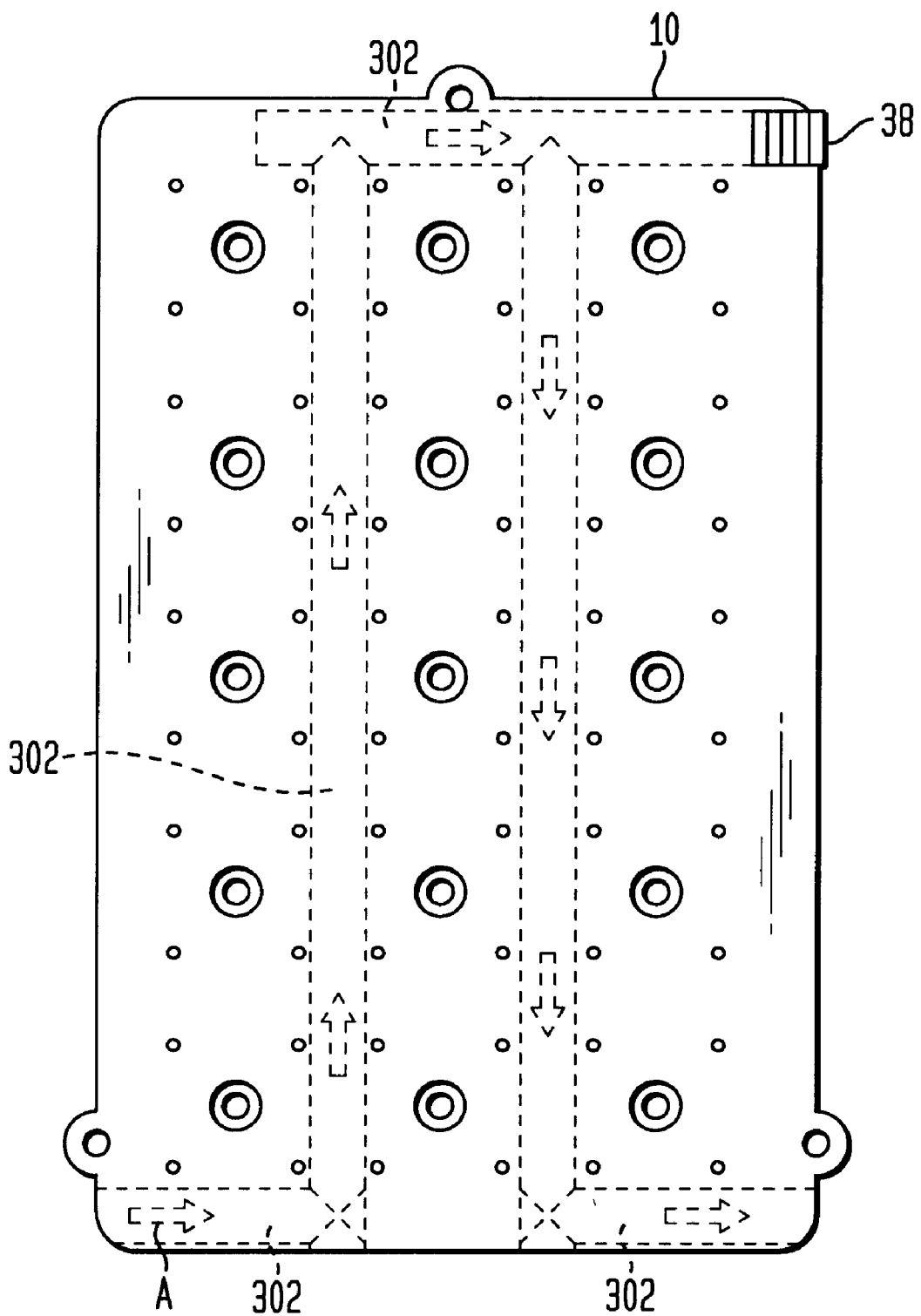
FIG. 3 shows detail of a thermal channel of the heat sink plate according to the present invention.

The heat sink plate 10 may also serve as a heat conductor in a third embodiment of the present invention. The heat sink plate 10 may be integrated with one or more thermal channels 302. As illustrated in FIG. 3, the heat sink plate 10 can be configured to conduct heat away from the detector modules 204. This can be accomplished, for example, by using a cooling fluid (not shown). The cooling fluid may be a liquid or a gas.

The cooling fluid (through a plug 38) may directly contact the projection 200, which then has a highly conductive thermal path through the conductive thermal layer 208, then to the detector module 204, which is the device to be cooled. The cooling fluid may flow in a flow direction (indicated by an arrow A) away from the detector module 204 along the thermal channel 302 of the heat sink plate 10. In other words, the heat generated by the detector module 204 can be absorbed by the cooling fluid, which travels along the thermal channel 302 away from the detector module 204. Alternatively, the cooling fluid may be run through the heat sink plate 10 in order to reduce the heat generated by the detector module 204 that contacts the heat sink plate 10. Accordingly, an even more efficient radiographic detector head for a radiographic imaging device can be realized.

The thermal channel 302 may be positioned between the through-holes 112. In addition, the thermal channel 302 may be located at the center of the heat sink plate 10 in a vertical direction, and at the top and bottom of the heat sink plate 10 in a horizontal direction forming a flow path. The flow path may be diagonal, zig zag or the like. It should be appreciated that any path that directs the cooling fluid away from the detector modules can be utilized.

According to the present invention, the heat sink plate 10 of the present invention is a multi-functional device that can aid in forming an efficient radiographic detector head comprising a plurality of detector modules in the same plane, removing the detector modules, and conducting heat away from the detector modules.

While the invention has been described in detail above, the invention is not intended to be limited to the specific embodiments as described. It is evident that those skilled in the art may now make numerous uses and modifications of and departures from the specific embodiments described herein without departing from the inventive concepts. For example, the heat sink plate of the present invention can be implemented or integrated in any environment as desired.

What is claimed is:

1. A planarizing heat sink plate having a top portion and a bottom portion, comprising:
   a plurality of receiving means formed therethrough and operable to receive a module ejection device;
   at least one removing means formed therethrough and operable to receive a driving device; and
   at least one planarizing projection formed on said bottom portion and adapted to receive a radiographic sensor module,
   wherein said at least one removing means is disposed between said plurality of receiving means, and
   said at least one planarizing projection corresponds to said at least one removing means.

2. The heat sink plate of claim 1, further comprising a thermal channel means operable to conduct heat away from the radiographic sensor module.

3. The heat sink plate of claim 2, wherein said thermal channel means forms a flow path for a cooling fluid.

4. The heat sink plate of claim 3, wherein said cooling fluid is run through said heat sink plate.

5. The heat sink plate of claim 2, wherein said cooling fluid is a liquid.

6. The heat sink plate of claim 1, wherein said planarizing projection maintains a substantially planar orientation of the radiographic sensor module with respect to other radiographic sensor modules.

7. The heat sink plate of claim 1, wherein said planarizing projection maintains a substantially planar orientation of an array of radiographic sensor modules with respect to other radiographic sensor module arrays in a multi-sensor device array.

8. The heat sink plate of claim 1, wherein said removing means receives the driving device to gradually eject the radiographic sensor module.

9. The heat sink plate of claim 8, wherein the radiographic sensor module is gradually ejected using controlled force.

10. The heat sink plate of claim 9, wherein said controlled force is applied by screwing the driving device through said removing means.

11. The heat sink plate of claim 1, wherein said heat sink plate is formed of a thermally conductive material.

12. The heat sink plate of claim 11, wherein said conductive material is metal.

13. A detector module removal system, comprising:
   a module ejection device;
   a heat sink plate adapted to receive said module ejection device; and
   a driving device operable to penetrate said module ejection device and said heat sink plate,
   wherein a detector module affixed to said heat sink plate is gradually ejected by applying controlled force using said driving device.

14. The detector module of claim 13, wherein said controlled force is applied by screwing said driving device through said heat sink plate.

15. The detector module removal system of claim 13, wherein said module ejection device comprises a main body with a top portion, a bottom portion and an aperture formed therethrough, and a plurality of elongated members extending from said bottom portion of said main body; and
   said heat sink plate comprises a top portion, a bottom portion, a plurality of pin holes formed therethrough and at least one through-hole formed therethrough.

16. The detector module removal system of claim 13, further comprising a printed circuit board affixed to said heat sink plate.

17. The detector module removal system of claim 16, wherein said heat sink plate maintains a substantially planar orientation of said printed circuit board.

18. The detector module removal system of claim 15, wherein said heat sink plate further comprises at least one projection corresponding to said at least one through-hole.

19. The detector module removal system of claim 18, wherein at least one detector module corresponds to said at least one projection of said heat sink plate.

20. The detector module removal system of claim 15, wherein said aperture of said module ejection device corresponds to said through-hole of said heat sink plate.

21. The detector module removal system of claim 15, wherein said aperture guides said driving device to said through-hole to remove the detector module.

22. The detector module removal system of claim 13, wherein said heat sink plate maintains a substantially planar orientation of the detector module with respect to other modules mounted to said heat sink plate.

23. The detector module removal system of claim 13, wherein said heat sink plate is formed of a thermally conductive material.

24. The detector module removal system of claim 23, wherein said conductive material is metal.

25. The detector module removal system of claim 13, wherein said heat sink plate maintains a substantially planar orientation of an array of radiographic sensor modules with respect to other radiographic sensor module arrays in a multi-sensor device array.

26. The detector module removal system of claim 15, wherein said driving device is threaded.

27. The detector module removal system of claim 26, wherein said through-hole comprises a threaded inner surface.

28. The detector module removal system of claim 27, wherein the threaded driving device screws into said threaded inner surface of said through-hole to controllably eject the detector module from said heat sink plate.

29. The detector module removal system of claim 27, wherein said aperture comprises a threaded inner surface.

30. The detector module removal system of claim 29, wherein the threaded driving device screws into said threaded inner surface of said aperture and said threaded inner surface of said through-hole to controllably eject the detector module from said heat sink plate.

31. The detector module removal system of claim 15, wherein said elongated members of said module ejection device correspond to said pin holes of said heat sink plate.

32. The detector module removal system of claim 31, wherein said elongated members are adapted to align said module ejection device with said heat sink plate.

33. The detector module removal system of claim 15, wherein said heat sink plate further comprises a thermal channel.

34. A method of removing a detector module, comprising the steps of:
   a) inserting a module ejection device through a heat sink plate containing the detector module, said module ejection device being aligned with said heat sink plate;
   b) providing a driving device through said module ejection device and said heat sink plate, said driving device being substantially perpendicular to said heat sink plate; and
   c) ejecting the detector module from said heat sink plate by gradually applying a controlled force using said driving device.

35. The method of claim 34, wherein said controlled force is applied by screwing said driving device through said heat sink plate.

* * * * *